(12) United States Patent
Galburt et al.

(10) Patent No.: US 6,781,674 B1
(45) Date of Patent: Aug. 24, 2004

(54) SYSTEM AND METHOD TO INCREASE THROUGHPUT IN A DUAL SUBSTRATE STAGE DOUBLE EXPOSURE LITHOGRAPHY SYSTEM

(75) Inventors: Daniel Galburt, Wilton, CT (US); Jos de Klerk, Eindhoven (NL)

(73) Assignee: ASML Holding N.V., Veldhoven (NL)

( * ) Notice: Subject to any disclaimer, the term of this patent is extended or adjusted under 35 U.S.C. 154(b) by 0 days.

(21) Appl. No.: 10/447,200

(22) Filed: May 29, 2003

(51) Int. Cl.$^7$ ........................ G03B 27/32; G03B 27/42
(52) U.S. Cl. ........................................ 355/77; 355/53
(58) Field of Search ............................. 355/53, 72–76, 355/77; 414/217, 936, 941; 310/10

(56) References Cited

U.S. PATENT DOCUMENTS 5,677,758 A * 10/1997 McEachern et al. .......... 355/75
5,897,986 A * 4/1999 Dunn et al. .................. 430/394
6,628,372 B2 * 9/2003 McCullough et al. ......... 355/75

\* cited by examiner

Primary Examiner—Henry Hung Nguyen
(74) Attorney, Agent, or Firm—Sterne, Kessler, Goldstein & Fox P.L.L.C.

(57) ABSTRACT

A lithography system and method are used to increase throughput using multiple reticles to pattern multiple substrates that are positioned with respect to one another according to a predetermined sequence. For example, during a first exposure period a first reticle patterns a first set of substrates, during a second exposure period a second reticle patterns a second set of substrates, during a third exposure period the first reticle patterns a third set of substrates, etc., until all desired substrates are patterned. It is to be appreciate that after the first and second reticles are complete, third and fourth reticles can pattern the first, second, third, etc. sets of substrates.

2 Claims, 3 Drawing Sheets

SYSTEM AND METHOD TO INCREASE THROUGHPUT IN A DUAL SUBSTRATE STAGE DOUBLE EXPOSURE LITHOGRAPHY SYSTEM

BACKGROUND OF THE INVENTION

1. Field of the Invention

The present invention is related to dual substrate stage double exposure lithography systems.

2. Background Art

Lithography is a process used to create features on the surface of substrates. Such substrates can include those used in the manufacture of flat panel displays, circuit boards, various integrated circuits, and the like. A frequently used substrate for such applications is a semiconductor wafer. While this description is written in terms of a semiconductor wafer for illustrative purposes, one skilled in the art would recognize that this description also applies to other types of substrates known to those skilled in the art. During lithography, a wafer, which is disposed on a wafer stage, is exposed to an image projected onto the surface of the wafer by exposure optics located within a lithography apparatus. While exposure optics are used in the case of photolithography, a different type of exposure apparatus can be used depending on the particular application. For example, x-ray, ion, electron, or photon lithographies each can require a different exposure apparatus, as is known to those skilled in the art. The particular example of photolithography is discussed here for illustrative purposes only.

The projected image produces changes in the characteristics of a layer, for example photoresist, deposited on the surface of the wafer. These changes correspond to the features projected onto the wafer during exposure. Subsequent to exposure, the layer can be etched to produce a patterned layer. The pattern corresponds to those features projected onto the wafer during exposure. This patterned layer is then used to remove or further process exposed portions of underlying structural layers within the wafer, such as conductive, semiconductive, or insulative layers. This process is then repeated, together with other steps, until the desired features have been formed on the surface, or in various layers, of the wafer.

Step-and-scan technology works in conjunction with a projection optics system that has a narrow imaging slot. Rather than expose the entire wafer at one time, individual fields are scanned onto the wafer one at a time. Moving the wafer and reticle simultaneously such that the imaging slot is moved across the field during the scan does this. The wafer stage must then be asynchronously stepped between field exposures to allow multiple copies of the reticle pattern to be exposed over the wafer surface. In this manner, the quality of the image projected onto the wafer is maximized.

Conventional lithographic systems and methods form images on a semiconductor wafer. The system typically has a lithographic chamber that is designed to contain an apparatus that performs the process of image formation on the semiconductor wafer. The chamber can be designed to have different grades of vacuum depending on the wavelength of light being used. A reticle is positioned inside the chamber. A beam of light is passed from an illumination source (located outside the system) through an optical system, through an image outline on the reticle, and a second optical system before interacting with a semiconductor wafer.

The reticle can be placed on a platform or stage (hereinafter, both are referred to as "stage"). The stage can be positioned according to parameters of the lithographic system. Similarly, the semiconductor wafer can be placed on a stage. The stage supporting either the reticle or the semiconductor wafer can be moved one or more directions and/or one or more degrees of freedom depending on how the image is to be formed on the semiconductor wafer.

In order to increase throughput, dual wafer stage systems have been developed. Typically, these dual stages can hold and independently control the motion of two wafers at the same time. Throughput is increased by allowing exposure of an aligned wafer on one chuck, while at the same time the second chuck is used to unload the previously exposed wafer, and then load and align the next unexposed wafer. Without the dual wafer stage these operations would have to be done sequentially.

In order to increase resolution, depth of focus, and process latitude the use of phase reticles has been introduced. Phase reticles often requires the exposure of not only the phase reticle, but the additional aligned exposure of a second trimming reticle to achieve the desired result. Thus each field must be exposed twice first with the phase reticle, and then again with the trim reticle, usually under different conditions of illumination. The most common method of executing this double exposure sequence is to first load the phase reticle and expose an entire wafer, then load the trim reticle, and re-expose the wafer. The wafer is then removed from the wafer stage, and the next wafer is loaded. Usually the order of exposure is not critical, so that this time, the trim reticle is exposed first, then the phase reticle is loaded and exposed. This is an "AABBAABB" sequence, which requires one reticle exchange for each wafer processed.

The number of reticle exchanges can be reduced by sequencing multiple wafers through system, and then switching reticles, but then each wafer must be handled twice, and the increased time delay between double exposures can cause process problems.

In some cases, the device being manufactured is small enough so that it is possible to fit both the phase pattern and trim patterns side by side on one reticle, but this is not generally practical. Also the use of a reticle stage that can carry and expose two reticles is possible, but in general rejected to avoid the reduced performance, and added cost that use of such a design may impose.

Therefore, there is a need for a system and method that increases throughput in a dual substrate stage, double exposure lithography system.

BRIEF SUMMARY OF THE INVENTION

Embodiments of the present invention provide a faster more efficient system and method of double exposing reticles on a lithographic system with a dual substrate stage. The method can include the following steps. Patterning a first set of substrates with a first reticle during a first exposure period. Exchanging the first reticle with a second reticle. Patterning the first set of substrates with the second reticle during a second exposure period. Exchanging the first set substrates with a second set of substrates. Patterning the second set of substrates with the second reticle during the second exposure period. Exchanging the second reticle with the first reticle. Patterning the second set of substrates with the first reticle during a third exposure period. Exchanging the second set of substrates with a third set of substrates. Patterning the third set of substrates with the first reticle during the third exposure period. Exchanging the first reticle with the second reticle. Patterning the third set of substrates with the second reticle during a fourth exposure period.

The substrates can be transported on the dual substrate stage between a processing system, which inputs and processes the substrates, and an exposure system, which inputs the reticles and exposes the substrates.

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention.

Figure 1:
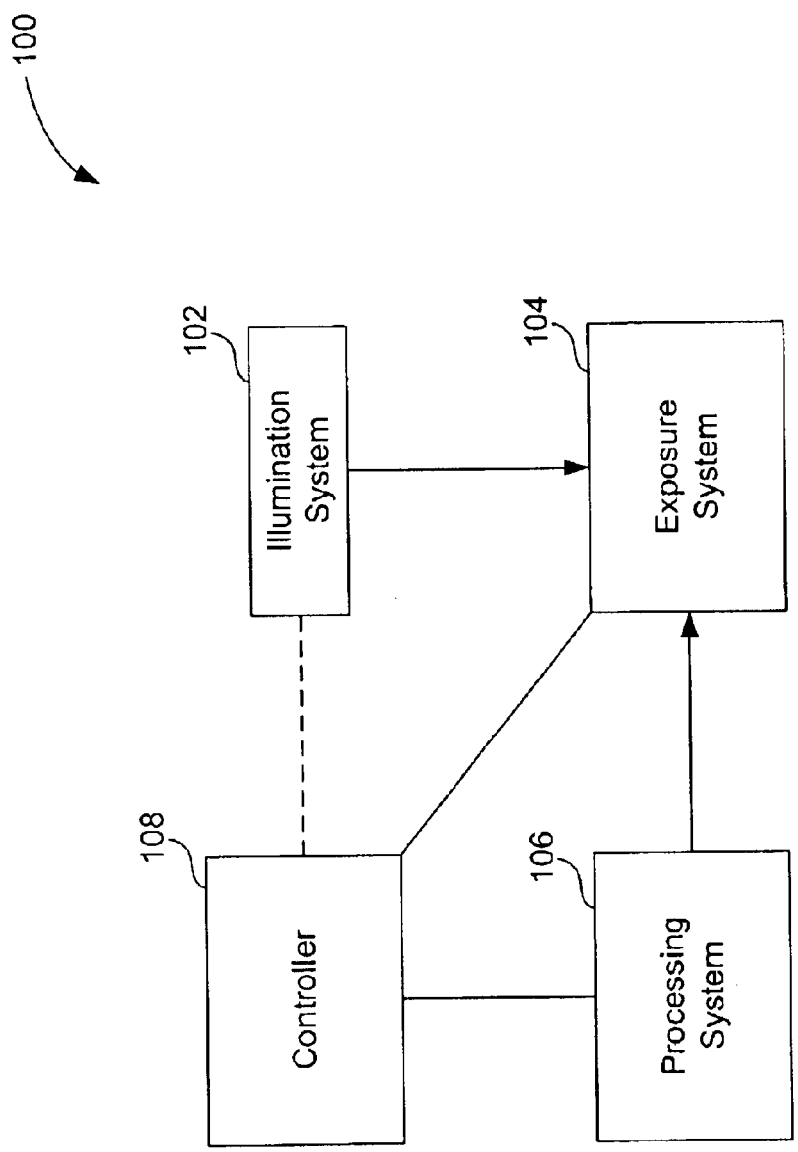
FIG. 1 is a block diagram of a lithography system according to the embodiments of the present invention.

The present invention is described with reference to the accompanying drawings. In the drawings, like reference numbers can indicate identical or functionally similar elements. Additionally, the leftmost digit of a reference number usually identifies the drawing in which the reference number first appears.

DETAILED DESCRIPTION OF THE INVENTION

Overview

While specific configurations and arrangements are discussed, it should be understood that this is done for illustrative purposes only. A person skilled in the pertinent art will recognize that other configurations and arrangements can be used without departing from the spirit and scope of the present invention. It will be apparent to a person skilled in the pertinent art that this invention can also be employed in a variety of other applications.

Embodiments of the present invention allow for a substantial increase in throughput for a dual substrate stage, double exposure lithography system. This is accomplished by reducing the number of reticle exchanges required to expose a same amount of substrates. As discussed above, conventional systems have only been designed to allow for AABB exposure of substrates. In the system and methods described in more detail below, AAAABBBB exposure can occur. Thus, two times as many substrates are exposed with a same reticle, which reduces reticle exchange and increases throughput. This increased throughput can be based on information or data stored in a controller. The controller is designed to sequence the dual substrate stage through a processing and exposure system correlated to sequencing between reticles into and out of the exposure system.

Throughout the specification, reticle and mask may be used interchangeably, which is not meant to be limiting.
Overall System and Method of Operation FIG. 1 shows a system 100 according to embodiments of the present invention. One example of system 100 can be a lithography system. Light emitted from an illumination system 102 (e.g., a light source, beam conditioning optics, illumination optics, and the like) is received by an exposure system 104 (e.g., reticle, reticle stage, projection optics, substrate stage, and the like). A controller 108 controls an operation of exposure system 104 and a processing system 106, as will be described in more detail below. Optionally, controller 102 can also control the illumination system to perform various functions (e.g., calibration), as is known in the art.

Figure 2:
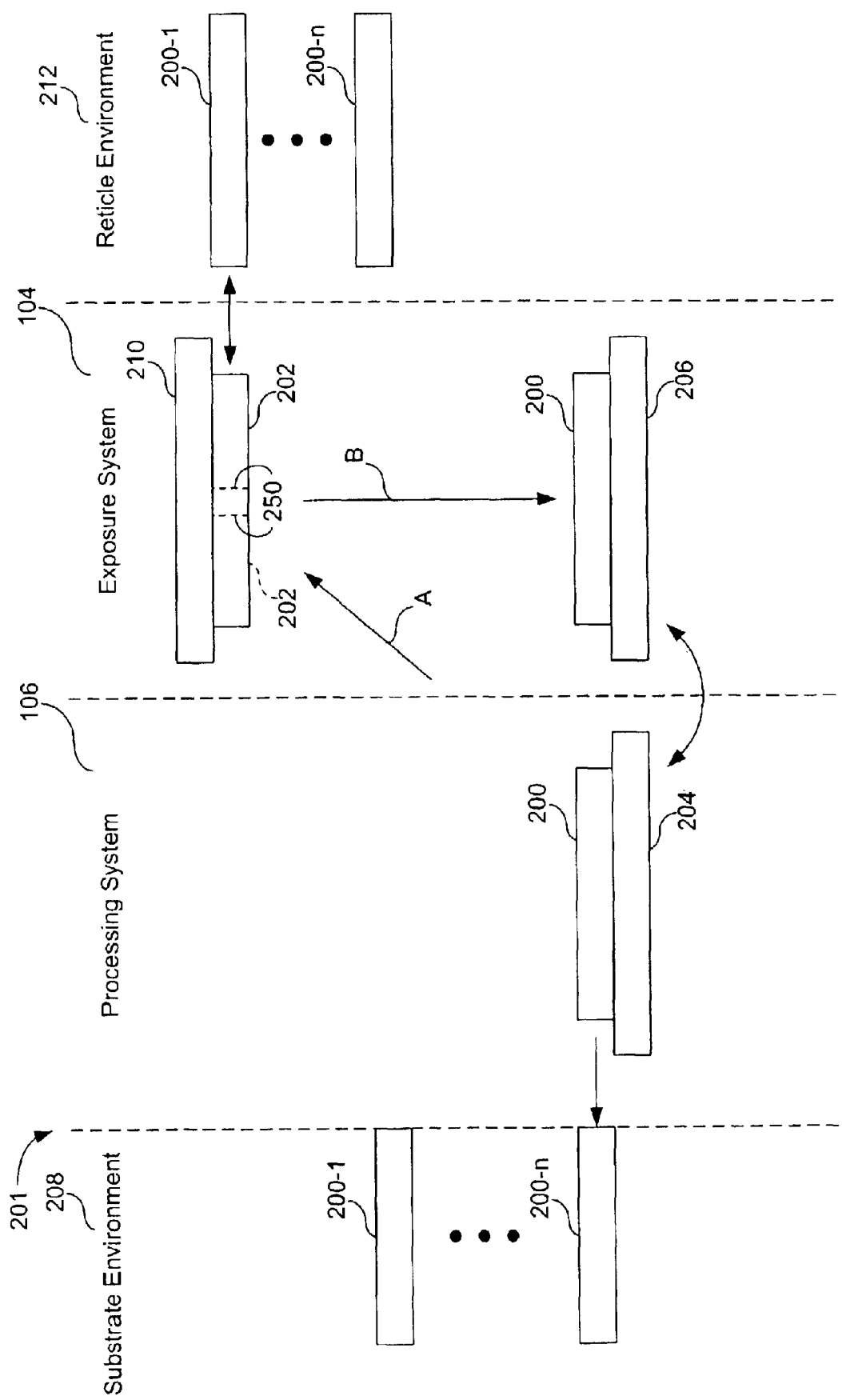
FIG. 2 shows a section of the lithographic system in FIG. 1 according to embodiments of the present invention.

FIG. 2 shows a section 201 of system 100 according to embodiments of the present invention. For example, section 201 can be a dual substrate stage, double exposure system. Section 201 includes processing system 106 and exposure system 104. Dashed lines are used to show a possible phantom or real separation between a substrate environment 208 (discussed below), processing system 106, exposure system 104, and reticle environment 212 (discussed below).

Processing system 106 includes a stage 204, which is a first section of a dual substrate stage that holds substrates 200 (e.g., wafers, printed circuit boards, liquid crystal displays, or the like). Processing system 106 can perform any processing of substrates 200 (e.g., measuring, aligning, etc.) known in the lithography arts. Substrates 200 are transported to processing system 106 via robot handlers (not shown), as is known in the art. In some embodiments, substrates 200-1 to 200-n can be transported through load locks (not shown) that couple a substrate environment 208 with an environment of processing system 106. For example, in EUV lithography, processing system 106 can have a vacuum environment, while the substrate environment may not be vacuum.

Exposure system 104 includes a stage 206, which is a second section of the dual substrate stage, and a reticle stage 210. Exposure system 104 can be coupled to a reticle environment 212 that holds one or more reticles 202-1 to 202-n. Reticles 202 can be transported back and forth from reticle environment 212 via robot handlers (not shown), or the like, as is known in the art. In some embodiments, reticles 202 can be transported through load locks (not shown) that couple reticle environment 212 with an environment of exposure system 104. For example, in EUV lithography exposure system 104 can have a vacuum environment.

In another embodiment, a plurality of reticles 202 can be supported by stage 210 at a same time, as is known in the relevant arts. For example, first and second reticles 202, as shown by dashed lines 250, can be coupled to stage 210. Stage 210 can move so the first and second reticles 202 are sequentially positioned to pattern the light from the illumination source during various exposure periods, as is described in more detail below. Thus, there may be no need for the reticle environment 212 depending on how many reticles 202 are being used for patterning substrates 200. An example of this type of system can be found in U.S. Ser. No. 09/785,777 to McCullough et al., which is incorporated by reference herein in its entirety.

During exposure, a light beam A from illumination system 102 can be patterned to form patterned beam B by reticle 202 either by reflection, as shown, or by transmission, as is known in the art. The patterned light beam B is used to write patterns of reticle 202 onto substrate 200.

Figure 3:
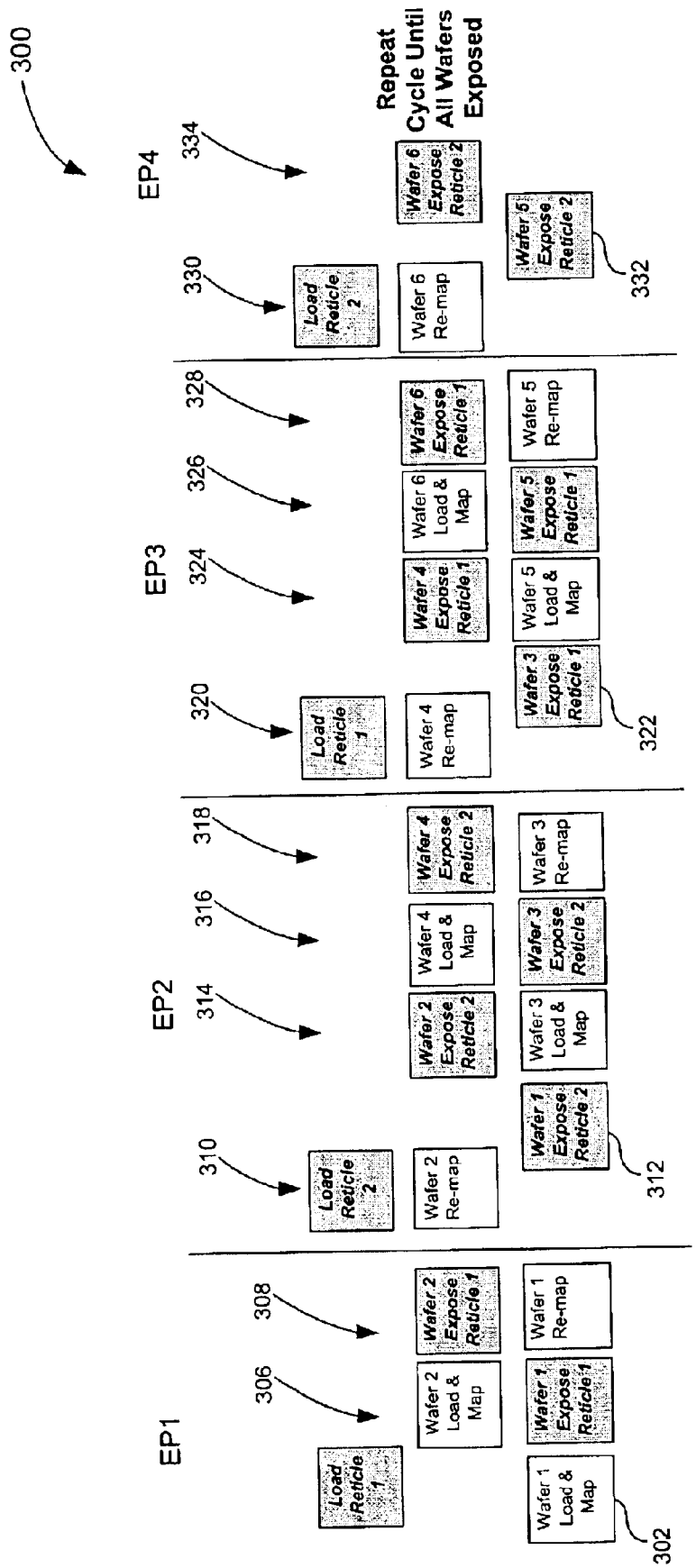
FIG. 3 shows steps for processing wafers according to embodiments of the present invention.

FIG. 3 shows a process for writing patterns of reticles 200 onto substrates 202, according to embodiments of the present invention. In the figure, first substrate 200-1 is shown as Wafer 1 and first reticle 202-1 is shown as Reticle 1, second substrate 200-2 is shown as Wafer 2 and second reticle 202-2 is shown as Reticle 2, and so on.

Process 300 is shown from left to right across the page. Controller 108 controls loading of reticles 202 onto stage 210, substrates 200 onto stages 204 and 206, and movement of stages 204 and 206. During each exposure period, one reticle 202 is used to expose a set of substrates 200. The various actions shown in the boxes can occur before, partially at a same time, or totally at a same time as other actions, as will be described in more detail below.

In an embodiment, stages 204 and 206 are moved between processing system 106 and exposure system 104 with substrates 200 securely coupled thereto.

During a first exposure period (EP1) the following steps can occur.

In step 302, a first substrate 200-1 is loaded onto stage 206 and processed. In step 304, a first reticle 202-1 is loaded onto stage 210.

In step 306, a second substrate 200-2 is moved onto stage 206 and processed. Also, in step 306, stage 204 is transported into exposure system 104, where substrate 200-1 is exposed with a pattern from first reticle 202-1.

In step 308, stages 204 and 206 are exchanged between exposure system 104 and processing system 106. Thus, second substrate 200-2 is exposed with a pattern from first reticle 202-1, while first substrate 200-1 is re-processed.

During a second exposure period (EP2), the following steps can occur.

In step 310, first reticle 202-1 is removed from stage 210 and second reticle 202-2 is loaded onto stage 210. Also, in step 310, stages 206 and 204 are exchanged between exposure system 104 and processing system 106. Further, in step 310, second substrate 200-2 is re-processed.

In step 312, first substrate 200-1 is exposed with a pattern from second reticle 202-2.

In step 314, stages 204 and 206 are exchanged between exposure system 104 and processing system 106. Also, in step 314, second substrate 200-2 is exposed with a pattern from second reticle 202-2. Further, in step 314, first substrate 200-1 is removed from processing system 106 and replaced with third substrate 200-3. Third substrate 200-3 is transported onto stage 204 and processed.

In step 316, stages 206 and 204 are exchanged between exposure system 104 and processing system 106. Also, in step 316, third substrate 200-3 can be exposed with a pattern from second reticle 202-2. Further, in step 316, second substrate 200-2 is removed from processing system 106 and replaced with a fourth substrate 200-4. Fourth substrate 200-4 is transported to stage 206 and processed.

In step 318, stages 204 and 206 are exchanged between exposure system 104 and processing system 106. Also, in step 318, fourth substrate 200-4 can be exposed with a pattern from second reticle 202-2. Further, in step 318, third substrate 200-3 can be reprocessed.

During a third exposure period (EP3) the following steps can be performed.

In step 320, first reticle 202-1 is exchanged with second reticle 202-2 on stage 210. Also, in step 320, stages 206 and 204 can be exchanged between exposing system 104 and processing system 106. Further, in step 320, fourth substrate 200-4 on stage 204 can be reprocessed.

In step 322, third substrate 200-3 can be exposed with a pattern from first reticle 202-1.

In step 324, stages 204 and 206 can be exchanged between exposing system 104 and processing system 106. Also, in step 324, fourth substrate 200-4 is exposed with a pattern from first reticle 202-1. Further, in step 324, third substrate 200-3 is removed from processing system 106 and replaced with a fifth substrate 200-5. Fifth substrate 200-5 is placed onto stage 204 and processed.

In step 326, stages 206 and 204 can be exchanged between exposure system 104 and processing system 106. Also, during step 326, fifth substrate 200-5 is exposed with a pattern from first reticle 202-1. Further during step 326, fourth substrate 200-4 is removed from processing system 106 and replaced with a sixth substrate 200-6. Sixth substrate 200-6 is placed onto stage 206 and processed.

In step 328, stages 204 and 206 are exchanged between exposure system 104 and processing system 106. Also, in step 328, sixth substrate 200-6 is exposed with a pattern from first reticle 202-1. Further, in step 328, fifth substrate 200-5 is reprocessed.

During a fourth exposure period (EP4) the following steps can occur.

In step 330, first reticle 202-1 is transported out of exposing system 104 and second reticle 202-2 is transported into exposing system 104 onto stage 210. Also, in step 330, stages 206 and 204 are exchanged between exposing system 104 and processing system 106. Further, in step 330, sixth substrate 200-6 is reprocessed.

In step 332, fifth substrate 200-5 is exposed with a pattern from second reticle 202-2.

In step 334, stages 204 and 206 are exchanged between exposure system 104 and processing system 106. Also, in step 334, sixth substrate 200-6 is exposed with a pattern from second reticle 202-2.

While the above embodiments are directed to double expose phase reticle lithography, it is to be appreciated in the future it can also be applied to new lithographic processes that require two or more reticles to be aligned and sequentially exposed on a substrate surface. In the case where more then two exposures are required, the throughput gain may be limited by the fact that the wafer stage can hold only two wafers simultaneously.

Conclusion

Example embodiments of the methods, circuits, and components of the present invention have been described herein. As noted elsewhere, these example embodiments have been described for illustrative purposes only, and are not limiting. Other embodiments are possible and are covered by the invention. Such embodiments will be apparent to persons skilled in the relevant art(s) based on the teachings contained herein. Thus, the breadth and scope of the present invention should not be limited by any of the above-described exemplary embodiments, but should be defined only in accordance with the following claims and their equivalents.

What is claimed is:

1. In a dual substrate stage, double exposure lithography system, a method comprising:

loading a first reticle onto a reticle stage in an exposure system;

loading, processing, and exposing a first pair of substrates, which are transported into and out of the exposure system via the dual substrate stage;

exchanging the first reticle for a second reticle;

processing and exposing the first pair of substrates, which are transported into and out of the exposure system via the dual substrate stage;

exchanging a second pair of substrates for the first pair of substrates;

processing and exposing the second pair of substrates, which are transported into and out of the exposure system via the dual substrate stage;

exchanging the second reticle for the first reticle;

processing and exposing the second pair of substrates, which are transported into and out of the exposure system via the dual substrate stage;

exchanging a third pair of substrates for the second pair of substrates;

processing and exposing the third pair of substrates, which are transported into and out of the exposure system via the dual substrate stage;

exchanging the first reticle for the second reticle; and processing and exposing the third pair of substrates, which are transported into and out of the exposure system via the dual substrate stage.

2. A dual substrate stage, double exposure system for performing a method comprising:

patterning a first set of substrates with a first reticle during a first exposure period;

exchanging the first reticle with a second reticle;

patterning the first set of substrates with the second reticle during a second exposure period;

exchanging the first set substrates with a second set of substrates;

patterning the second set of substrates with the second reticle during the second exposure period;

exchanging the second reticle with the first reticle;

patterning the second set of substrates with the first reticle during a third exposure period;

exchanging the second set of substrates with a third set of substrates;

patterning the third set of substrates with the first reticle during the third exposure period;

exchanging the first reticle with the second reticle; and patterning the third set of substrates with the second reticle during a fourth exposure period.

* * * * *